United States Patent [19]

Ganguly et al.

[11] 4,410,833
[45] Oct. 18, 1983

[54] SOLID STATE MAGNETRON

[75] Inventors: Achintya K. Ganguly, Alexandria, Va.; Denis C. Webb, College Park, Md.

[73] Assignee: The United States of America as represented by the Secretary of the Navy, Washington, D.C.

[21] Appl. No.: 269,456

[22] Filed: Jun. 2, 1981

[51] Int. Cl.³ .............................................. H01J 25/50
[52] U.S. Cl. .............................. 315/39.51; 315/39.53; 315/39.75; 330/4.9; 330/5
[58] Field of Search ............... 315/39.51, 39.53, 39.75, 315/3.5; 330/4.6, 4.9, 5

[56] References Cited
U.S. PATENT DOCUMENTS

| | | |
|---|---|---|
| 2,760,013 | 8/1956 | Peter .................................. 315/3.5 X |
| 3,048,797 | 8/1962 | Linder .......................... 315/39.51 X |
| 3,863,167 | 1/1975 | Harth et al. .......................... 330/4.6 |
| 4,104,559 | 8/1978 | Hobbs .............................. 315/39.51 |

Primary Examiner—Saxfield Chatmon, Jr.
Attorney, Agent, or Firm—Robert F. Beers; William T. Ellis; Alan P. Klein

[57] ABSTRACT

A magnetron in which the space between the anode and cathode contains a high mobility semiconductor. The structure is non-cylindrically symmetric because the anode and cathode are placed on top of the semiconductor. The electrons are injected into the substrate and then accelerated toward the anode members where they are extracted. Alternate anode members are strapped together to favor excitation of the $\pi$-mode.

18 Claims, 2 Drawing Figures

SOLID STATE MAGNETRON

BACKGROUND OF THE INVENTION

This invention relates to a magnetron, and more particularly to a magnetron employing a semiconductor element.

Numerous devices have been demonstrated or proposed for generating electromagnetic energy at near-millimeter wavelengths (0.03 to 0.003 cm.). The list includes optically pumped submillimeter wave lasers and electron beam devices such as the electron cyclotron maser, traveling wave tube, klystron and carcinatron. Such devices have application as local oscillators in superheterodyne receivers or as sources for laboratory measurements. They can also serve as the transmitter of short range (low power) radars or communication systems. However, these devices are impractical for many such applications because of their excessive size, weight, cost and prime power requirements. Thus, solid-state alternatives are highly desirable. The most widely used solid-state device at frequencies above 100 GHz is the IMPATT diode which is difficult to fabricate and heat sink and which generates a very noisy signal. Other alternatives, e.g. the TUNNETT diode and the solid-state gyrotron, have been proposed but have not been developed to the point of usefulness as yet.

SUMMARY OF THE INVENTION

It is therefore one object of the present invention to generate electromagnetic energy at near-millimeter wavelengths.

Another object is to generate near-millimeter wave energy with a device of small dimensions.

These and other objects are achieved by a planar solid-state magnetron. The magnetron includes a plate whose body is formed from a semiconductor material and whose top surface is partially coated with a conducting film. The partial conducting film coating comprises a cathode and a plurality of anode members radially spaced from the cathode. Adjacent anode members together with the space therebetween define resonant cavities. Means is provided for directing electrons from the cathode to the anode by electrical conduction through the semiconductor body of the plate.

The planar solid-state magnetron is especially attractive for generating electromagnetic energy at frequencies greater than 200 GHz. It promises to have an order of magnitude better efficiency than alternate solid-state approaches, and to exhibit reasonably good noise properties. The structure is small, having features whose dimensions are of the order of microns, but because of its planar geometry is simple to fabricate with conventional photolithography. Further, it is amenable to cascading for higher output power.

BRIEF DESCRIPTION OF THE DRAWINGS

A more complete application of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENT

Figure 1:
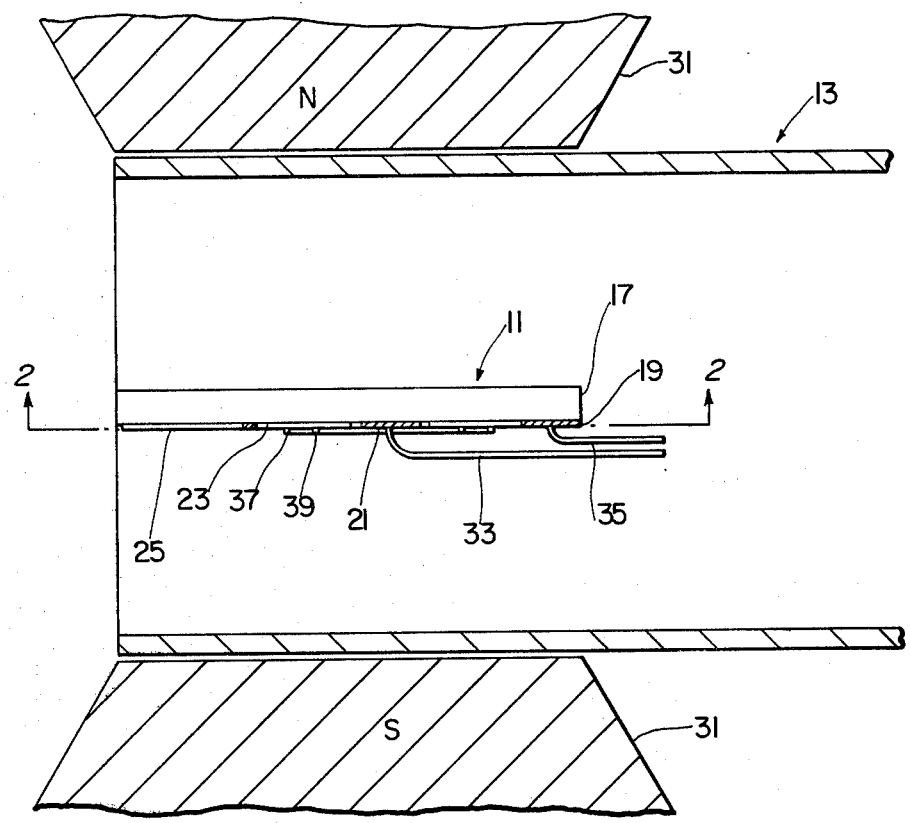
FIG. 1 is a horizontal cross-sectional view, taken along line 1—1 of FIG. 2, of a magnetron built in accordance with this invention.
Figure 2:
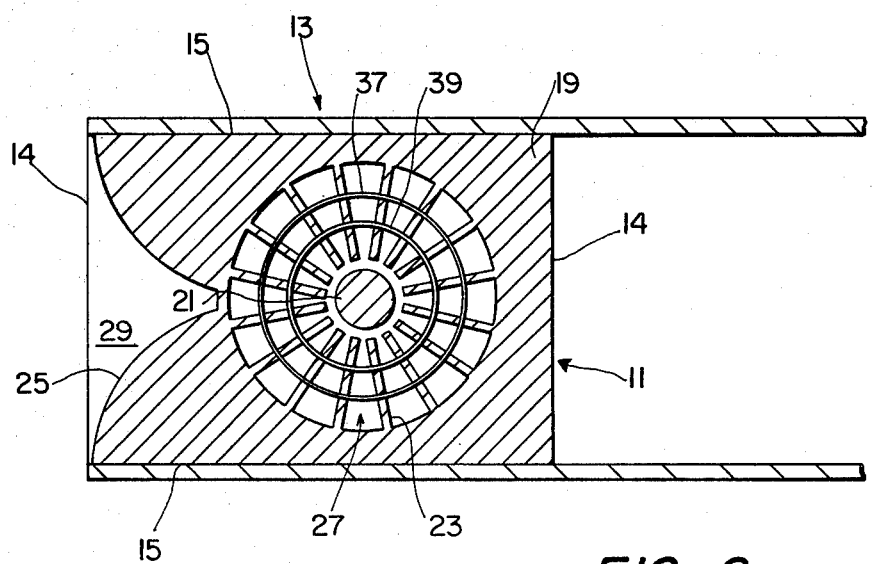
FIG. 2 is a vertical cross-sectional view taken along line 2—2 of FIG. 1.

Referring to FIGS. 1 and 2, the planar solid-state magnetron comprises a rectangular plate 11 fitted inside a rectangular waveguide 13. The plate 11 is aligned along the longitudinal axis of the waveguide 13 such that one pair of opposing edges 14 of its top face are normal to the top and bottom walls of the waveguide and the other pair of opposing edges 15 of its top face are parallel to and in contact with the top and bottom walls of the waveguide. The waveguide 13 must have side walls separated by more than a half-wavelength at the frequency of operation of the magnetron. The body 17 of the plate 11 is formed from a high mobility semiconductor such as InSb or a GaAs-(AlGa)As superlattice, for example. The top face of the plate is partially coated with a conducting film 19 such as gold having a thickness of the order of $10^{-5}$ cm. The partial film coating 19 takes the form of a disc 21, a plurality of rectangular members 23 radially spaced from the disc, and an envelope 25 enclosing and connecting the radial members. The disc 21 constitutes the cathode of the magnetron; the radial members 23 and envelope 25 constitute the anode of the magnetron. Each pair of adjacent radial members 23 of the anode, together with the space 27 therein, defines a cavity resonator which basically determines the frequency of operation of the magnetron. The top face of the plate 11 is uncoated in a region 29 extending outwardly from the neighborhood of one of the cavities to an edge 14 lying normal to the top and bottom walls of the waveguide 13.

The magnetic pole pieces 31 of the magnetron are applied adjacent the exteriors of the side walls of the waveguide 13 to produce the required magnetic field across the interaction space between the cathode and the anode members. Leads 33 and 35 are attached to the anode and the the cathode whereby an external potential can be applied between the cathode and anode.

The planar solid-state magnetron differs from conventional devices in that the cathode and anode are coated on top of a semiconducting body, and therefore the structure is non-cylindrically symmetric.

In operation, electrons are injected by the external potential source into the semiconducting plate 11 which conducts them in a spiral path around the cathode on their way to the anode. For optimum efficiency the semiconductor material is preferably selected to have a mean-free-path no less than the distance between the cathode 21 and the anode members 23 to minimize the effect of collisions. As the carrier electrons in the semiconducting body 17 pass the cavity openings they produce electromagnetic oscillations in the cavities. The electrical power contained in these oscillations is coupled out to the uncoated region 29 of the plate adjacent one of the cavities and is radiated to the waveguide 13, thereby exciting propagating modes in the waveguide which provide the magnetron output.

A pair of thin film metal straps 37 and 39 are connected to alternate anode members 23 to favor operation of the magnetron in the $\pi$-mode (the relative phase between adjacent cavity resonators differing by 180°) without the interference of spurous modes. The action of these straps is well known and more fully disclosed in U.S. Pat. No. 2,417,789 issued Mar. 18, 1947.

The planar solid-state magnetron may have its operation considerably enhanced by cooling it. Lowering the temperature reduces scattering in the semiconductor crystal and thus produces a longer mean-free-path which permits the carrier electrons or holes to achieve a larger number of cycles of motion without disturbance due to scattering. Hence the magnetron may be contained in a cooling device such as a Dewar flask (not shown) in which the plate 11 is substantially surrounded by liquid nitrogen or liquid helium, for example.

Suitable dimensions for a planar solid-state magnetron of this form operating at 94 GHz in a magnetic field of about 1 kilogauss with an applied external potential of 0.5 volts are as follows:

| | |
|---|---|
| Diameter of cathode | $5 \times 10^{-3}$ cm. |
| Diameter of cavity region | $4.4 \times 10^{-2}$ cm. |
| Spacing between cathode and anode members | $5 \times 10^{-4}$ cm. |
| Width of anode members | $5 \times 10^{-4}$ cm. |
| Thickness of plate | $5 \times 10^{-2}$ cm. |

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A planar solid-state magnetron comprising:
   a plate whose body is formed from a semiconductor material and whose top surface is partially coated with a conducting film,
   the partial conducting film coating including a cathode and a plurality of anode members radially spaced from the cathode,
   adjacent anode members together with the space therebetween defining resonant cavities; and
   means for directing electrons from the cathode to the anode by electrical conduction through the semiconductor body of the plate.

2. The planar solid-state magnetron recited in claim 1 wherein the electron-directing means includes:
   a pair of leads attached respectively to the anode and cathode, whereby an external potential can be applied between the cathode and anode.

3. The planar solid-state magnetron recited in claim 1 wherein the electron-directing means includes:
   a pair of magnetic pole pieces for producing a magnetic field across the interaction space between the cathode and anode.

4. The planar solid-state magnetron recited in claim 1 including: 'means for favoring operation of the magnetron in the $\pi$-mode without the interference of spurious modes.

5. The planar solid-state magnetron recited in claim 4 wherein the $\pi$-mode operation favoring means includes:
   a pair of conducting straps connected to alternate anode members.

6. The planar solid-state magnetron recited in claim 1 including:
   means for coupling out electrical power contained in electromagnetic oscillations produced in the resonant cavities.

7. The planar solid-state magnetron recited in claim 6 wherein the output power coupling means includes:
   a waveguide surrounding the plate.

8. The planar solid-state magnetron recited in claim 1 wherein:
   the semiconductor has a high mobility.

9. The planar solid-state magnetron recited in claim 1 wherein:
   the semiconductor is InSb.

10. The planar solid-state magnetron recited in claim 1 wherein:
    the semiconductor is a GaAs-(AlGa) As superlattice.

11. A planar solid-state magnetron comprising:
    a plate whose body is formed from a semiconductor and whose top surface is partially coated with a conducting film,
    the partial conducting film coating forming at least one cavity resonator and including a cathode and an anode spaced from the cathode; and
    means for directing electrons from the cathode to the anode by electrical conduction through the semiconductor body.

12. The planar solid-state magnetron recited in claim 11 wherein the electron-directing means includes:
    a pair of leads attached respectively to the anode and cathode, whereby an external potential can be applied between the cathode and anode.

13. The planar solid-state magnetron recited in claim 11 wherein the electron-directing means includes:
    a pair of magnetic pole pieces for producing a magnetic field across the interaction space between the cathode and anode.

14. The planar solid-state magnetron recited in claim 11, including:
    means for coupling out electrical power contained in electromagnetic oscillations produced in the cavity resonator.

15. The planar solid-state magnetron recited in claim 14 wherein the output power coupling means includes:
    'a waveguide surrounding the plate.

16. The planar solid-state magnetron recited in claim 11, wherein:
    the semiconductor has a high mobility.

17. The planar solid-state magnetron recited in claim 11, wherein:
    the semiconductor is InSb.

18. The planar solid-state magnetron recited in claim 11 wherein:
    the semiconductor is a GaAs-(AlGa) As superlattice.

* * * * *